(12) United States Patent
Holm et al.

(10) Patent No.: US 7,011,382 B2
(45) Date of Patent: Mar. 14, 2006

(54) METHOD OF JETTING VISCOUS MEDIUM

(75) Inventors: William Holm, Älvsjö (SE); Mikael Kamfors, Bromma (SE); Magnus Fridsell, Sollentuna (SE)

(73) Assignee: Mydata Automation AB, Bromma (SE)

(*) Notice: Subject to any disclaimer, the term of this patent is extended or adjusted under 35 U.S.C. 154(b) by 66 days.

(21) Appl. No.: 10/398,712

(22) PCT Filed: Oct. 9, 2001

(86) PCT No.: PCT/SE01/02198

§ 371 (c)(1),
(2), (4) Date: Jul. 9, 2003

(87) PCT Pub. No.: WO02/32201

PCT Pub. Date: Apr. 18, 2002

(65) Prior Publication Data
US 2004/0118935 A1    Jun. 24, 2004

(30) Foreign Application Priority Data
Oct. 9, 2000   (SE) ................................. 0003647

(51) Int. Cl.
*B41J 29/38*   (2006.01)
*B41J 29/393*   (2006.01)

(52) U.S. Cl. .......................................... 347/9; 347/19
(58) Field of Classification Search ............... 347/5–6, 347/8–11, 14, 19, 74–75, 78–81, 54, 57, 37
See application file for complete search history.

(56) References Cited

U.S. PATENT DOCUMENTS

| 5,855,323 A | 1/1999 | Yost et al. .................. 239/135 |
| 5,889,534 A * | 3/1999 | Johnson et al. ............... 347/19 |
| 6,260,937 B1 * | 7/2001 | Sugahara ....................... 347/14 |
| 6,364,447 B1 * | 4/2002 | Boleda et al. ................. 347/19 |
| 6,499,821 B1 * | 12/2002 | Nozawa ....................... 347/14 |

FOREIGN PATENT DOCUMENTS

| DE | 43 18 506 A1 | 12/1994 |
| EP | 0 791 462 A2 | 8/1997 |
| EP | 0 992 815 A2 | 4/2000 |
| JP | 9-323056 A | 12/1997 |
| JP | 10-294557 A | 11/1998 |
| JP | A 10-294557 | 11/1998 |
| JP | A 10-341074 | 12/1998 |
| SE | B 461 822 | 3/1990 |

(Continued)

*Primary Examiner*—Hai Pham
(74) *Attorney, Agent, or Firm*—Birch, Stewart, Kolasch & Birch, LLP

(57) ABSTRACT

The invention relates to a method of improving the performance of a jetting assembly in an apparatus for jetting droplets of viscous medium on the fly onto a substrate. The jetting assembly is releasably mounted in the apparatus and includes a nozzle, an ejection mechanism connected to the nozzle, and a viscous medium container connect to the eject mechanism. Information relating to an XY-position and a Z-position is obtained together with information regarding the exit velocity a droplet of viscous medium has when it exits the nozzle. The information is used as a basis for adjusting a trigger position of the nozzle for the subsequent jetting of droplets. The invention also concerns such a jetting assembly including storage device arranged to receive and hold calibration information of properties of the assembly obtained during calibration measurements.

29 Claims, 10 Drawing Sheets

FOREIGN PATENT DOCUMENTS

| | | |
|---|---|---|
| SE | C2 513 527 | 9/2000 |
| WO | A1 90/00852 | 1/1990 |
| WO | WO 98/24291 A2 | 6/1998 |
| WO | WO 98/36864 A2 | 8/1998 |

* cited by examiner

METHOD OF JETTING VISCOUS MEDIUM

This application is the national phase under 35 U.S.C. § 371 of PCT International Application No. PCT/SE01/02198 which has an International filing date of Oct. 9, 2001, which designated the United States of America.

TECHNICAL FIELD

The present invention relates to the field of jetting viscous medium onto substrates. More particularly, the invention relates to a method of improving the performance of a jetting assembly in an apparatus for jetting droplets of viscous medium onto a substrate.

TECHNICAL BACKGROUND

Within the field of jetting droplets of viscous medium onto a substrate, particularly solder paste onto an electronic circuit board, there is an increased desire to perform the actual jetting "on the fly", i.e. with relative movement between the substrate and the jetting device during jetting and without stopping for each location on the substrate where viscous medium is to be deposited, in order to increase the manufacturing speed of electronic circuit boards.

A further means for improving the manufacturing speed of electronic circuit boards is to provide reduced idle time of the manufacturing line. One way of doing this is disclosed in the co-pending International patent application published under WO 00/61297, which discloses an exchangeable assembly for jetting droplets of viscous medium onto a substrate and is incorporated herein by reference. As evident from said application, such an assembly, inter alia, improves the flexibility and reduces the idle time of a jetting apparatus.

Due to the high quality requirements of the electronic industry and the detrimental consequences of error prone circuit boards, a high degree of accuracy and reproducibility is required, along with a high level of flexibility. This requirement is even further accentuated by the increased speed at which a substrate is provided with viscous medium.

SUMMARY OF THE INVENTION

Thus, the object of the present invention is to address the problem of improving the degree of accuracy and reproducibility in a jetting apparatus, and having a high level of flexibility.

This and other objects are achieved according to the present invention by providing a method having the features defined in the independent claims. Preferred embodiments are defined in the dependent claims.

According to a first aspect of the present invention there is provided a method of improving the performance of a jetting assembly in an apparatus for jetting droplets of viscous medium on the fly onto a substrate, said jetting assembly being releasably mounted in said apparatus for performing said jetting, said jetting assembly comprising a nozzle, an ejection mechanism connected to the nozzle, and a viscous medium container connected to the eject mechanism. The method comprises the steps of obtaining information relating to an XY-position of the nozzle in relation to a calibration surface, the XY-position being the position of the nozzle in a plane parallel to the plane of the calibration surface; obtaining information relating to a Z-position of the nozzle, the Z-position being the distance between the nozzle and the calibration surface; obtaining velocity information relating to the exit velocity a droplet of viscous medium has when said droplet exits said nozzle; and adjusting, on the basis of said information relating to an XY-position of the nozzle, said information relating to a Z-position of the nozzle, and said velocity information, a trigger position of the nozzle for the subsequent jetting of droplets.

According to a second aspect of the present invention there is provided a jetting assembly, said assembly being releasably mountable in an apparatus for jetting droplets of viscous medium on the fly onto a substrate, said assembly comprising an assembly holder having first holder portions mating with an assembly support of a docking device of the apparatus, a nozzle, an eject mechanism connected to the nozzle, a viscous medium container connected to the eject mechanism, a signal interface for communication with the apparatus, and storage means holding information about properties of the assembly, such as assembly identity, type of viscous medium contained, nominal mechanical offset of the nozzle, wherein said storage means is further arranged to receive and hold calibration information of properties of the assembly obtained during calibration measurements.

According to a third aspect of the present invention there is provided use of information stored in a jetting assembly for calibrating said assembly in a jetting apparatus.

For the purposes of this application, it is to be noted that the term "viscous medium" should be interpreted as solder paste, flux, adhesive, conductive adhesive, or any other kind of medium used for fastening components on a substrate, conductive ink, resistive paste, or the like; and that the term "substrate" should be interpreted as a printed circuit board (PCB), a substrate for ball grid arrays (BGA), chip scale packages (CSP), quad flat packages (QFP), wafers, flip-chips, or the like.

It is also to be noted that the term "jetting" should herein be interpreted as a non-contact dispensing process that utilises a fluid jet to form and shoot droplets of a medium from a jet nozzle onto a substrate, as compared to a contact dispensing process, such as "fluid wetting", which is the act of the medium leaving the dispense tip, contacting and clinging to the substrate and remaining on the substrate as the dispense tip pulls away.

Thus, the present invention is based on the advantageous insight of gathering, for a jetting assembly for use in a jetting apparatus adapted for jetting on the fly, calibration information relating not only to the actual XY-position of the nozzle, but also to the actual Z-position of the nozzle and the exit velocity of jetted droplets, and using this calibration information for adjusting jetting parameters.

When a releasable and exchangeable jetting assembly mounted in a jetting apparatus, adapted for jetting on the fly, is exchanged for another jetting assembly, there might be the possibility that the new assembly has jetting properties that differs slightly from that of the previous assembly. These jetting properties may include the relative position of the nozzle, the exit velocity of the jetted droplets, characteristics of the viscous medium that affects how the viscous medium responds to the ejection process. Also, there is the possibility that after the mounting of the assembly in the jetting apparatus, the alignment of said assembly deviates from the one intended.

In order to be able to compensate for any deviations of a deposit on a substrate, resulting from jetting a droplet onto the substrate, from that intended, it is necessary to obtain information relating to the jetting results. According to the present invention, this is performed by jetting viscous medium onto a calibration surface prior to the actual jetting of viscous medium onto intended locations on a substrate, determining the results of said jetting, and adjusting jetting parameters based on said result. Thereby, the jetting assembly is calibrated.

According to the present invention, both the actual position of the nozzle in a direction essentially perpendicular to the plane of the substrate, i.e. the Z-direction, as well as the exit velocity of the jetted droplets are determined. Thus, the calibration method according to the invention provides additional information to the actual position of the nozzle in a plane parallel to that of the substrate, i.e. the XY-direction. Thereby, a jetting assembly using the method of the present invention has an improved accuracy of the jetting result since deviations in the height of the nozzle relative the substrate and in the velocity of the droplets is taken care of.

Due to the relative motion between the nozzle and the substrate when a droplet is jetted, since the droplets are jetted on the fly, the ballistic trajectory of the jetted droplet has an impact on the position of the resulting deposit on the substrate. The method of the present invention is advantageous in that both the distance between the nozzle and the substrate, i.e. the travelling distance for the droplet in the Z-direction, and the exit velocity, i.e. the velocity in the Z-direction, is obtained and any deviations compensated for. Consequently, according to the invention, not only the actual nozzle position, but also the ballistic trajectory of the jetted droplet is taken into account, thereby improving the result of the jetted droplets and, in turn, improves the quality of assembled circuit boards and significantly reduces the occurrence of error prone circuit boards.

The method according to the present invention compensates for the ballistic trajectory by accurately controlling the relative velocity between the substrate and the nozzle, and by accurately determining the actual exit velocity of the jetted droplet as well as the actual nozzle height over the substrate.

According to preferred embodiments of the present invention, information relating to the XY-position of the nozzle is obtained by first jetting one or more droplets of viscous medium at a nominally predetermined location on a calibration surface. Thereby, the droplets form corresponding deposits on said calibration surface. According to this embodiment, there is no relative motion between the substrate and the jetting assembly at the instant a droplet is jetted. Then, the resulting actual position of the deposits are measured and the offset between the actual position and an expected nominal position is determined. The offset is then used for calculating the actual XY-position of the nozzle.

According to a preferred embodiment of the invention, information relating to the Z-position of the nozzle is obtained by first jetting one or more droplets of viscous medium at a nominally predetermined location on the calibration surface. The jetting is performed on the fly, i.e. with the nozzle moving parallel with and relative to the calibration surface. Then, the resulting actual position of the deposits are measured and the differences between the measured positions of the deposits and the actual XY-location of the nozzle when the droplets were ejected are calculated. Then, when knowledge of the exit velocity of the jetted droplets already have been obtained, these differences are used as a basis for calculating the Z-position of the nozzle, i.e. the distance between the nozzle and the calibration surface.

According to one preferred embodiment, the exit velocity has been previously determined and is, preferably, stored in storing means of the jetting assembly.

However, according to another preferred embodiment of the invention, the exit velocity may not be known when the Z-position of the nozzle is to be determined. Then, the above mentioned jetting of viscous medium droplets on the fly, and the measurement of the resulting positions of the deposits, is followed by a further jetting of viscous medium droplets on the fly. However, this second jetting of droplets on the fly is performed following a accurately controlled change in Z-position of the nozzle. Then, the resulting actual position of the deposits are measured and the differences between the measured positions of the deposits and the actual XY-location of the nozzle when the droplets were ejected are calculated. These resulting differences are compared to the differences resulting from the above mentioned jetting on the fly from the original Z-position of the nozzle. Having precise knowledge and control of the relative velocity between the nozzle and the substrate, the exit velocity can now be calculated.

Preferably, the velocity of the relative movement between the substrate and the jetting assembly are the same for the jetting of droplets at both Z-positions of the nozzle.

An alternative to measuring the Z position of the nozzle of the jetting assembly in the manner described above, is to measure a Z position for the assembly once the assembly has been mounted in the machine, i.e. to measure a Z position for the nozzle of the assembly. This could provide for some extra safety in that it reduces the risk of involuntary contact between the nozzle and the substrate, or with components already mounted on the substrate. Furthermore, it may enable a subsequent calibration procedure to be performed with the nozzle at a closer distance to the calibration surface, which could enhance the accuracy of the calibration measurements.

According to one embodiment, this is performed by bringing a portion of the assembly in contact with the calibration surface. This must be performed with great care so that neither the assembly nor the substrate is damaged. Since the relative distance in the Z-direction between the portion of the assembly that is brought into contact with the substrate and the nozzle is accurately known, the distance between the nozzle and the substrate is thereby determined. Then, the assembly can be raised a controlled amount for performing the subsequent jetting of viscous medium.

According to an alternative embodiment, the Z-position of the nozzle is measured using an electric or optical sensor, for instance in the form of an LED and a corresponding detector, or in the form of vision means such as a camera. As readily understood by those skilled in the art, a wide variety of sensing or measurement means, mechanical, optical or electrical, may be used for determining the Z-position of the nozzle prior to the jetting of viscous medium.

According to a preferred embodiment of the invention, the Z-position of the nozzle is obtained through direct measurements, as described above, and not calculated through position measurements of viscous medium deposits. Then, since the Z-position of the nozzle is known prior to obtaining information regarding the exit velocity of the jetted droplets, the exit velocity can be obtained in a simplified manner. This may be performed by simply jetting one or more droplets of viscous medium on the fly at a nominally predetermined location on the calibration surface. Then, the resulting actual position of the deposits are measured and the differences between the measured positions of the deposits and the actual XY-location of the nozzle when the droplets were ejected are calculated. Since the relative velocity between the nozzle and the substrate can be precisely controlled and the distance between the nozzle and the substrate has been accurately measure and is known, the exit velocity can now be accurately calculated.

For the above measurements, it can be enough to jet on droplet of viscous medium for each measurement. However, if a plurality of deposits are deposited, any stochastic contribution to the jet direction can be averaged out to even further improve the accuracy of the measurements.

Furthermore, for the preferred embodiments where the Z-position of the nozzle is calculated through position measurements of viscous medium deposits, if some portion of the assembly is at a lower position than the nozzle exit hole, then the height determined from the calibration described above does not reveal the whole truth about how low Z value can be used while jetting. In compensation for this, the distance between the nozzle and the lowest point of the assembly is preferably measured when assembling the assembly, and this measurement information is distributed to the jetting apparatus in connection with the mounting of the assembly in the apparatus. Preferably, said measurement information is stored in storage means of the assembly and transmitted to the apparatus via a signal interface.

According to an embodiment of the invention, the calibration surface is provided at a calibration station in the jetting apparatus that is separate from the substrate.

Alternatively, the substrate onto which the viscous medium is to be applied includes a portion that is not intended to be provided with viscous medium deposits and is used as a calibration surface. In this embodiment, the height of the substrate, or at least the calibration surface thereof, is determined prior to the jetting of droplets onto the calibration surface. Said height determination is preferably performed using a vision device, preferably a camera in combination with suitable lighting.

To ascertain that the droplets impact at the correct position on the substrate, it is preferred that the actual position of the nozzle when the jetting of a droplet is triggered can be determined to a high degree. The actual position of the nozzle includes not only the X position and the Y position, i.e. the position of the nozzle in a plane parallel to the plane of the substrate, but also the Z position, i.e. the height of the nozzle above the substrate.

Preferably, for process stability reasons, a calibration of the assembly is desirably performed immediately following the mounting of the jetting assembly in a jetting apparatus. Furthermore, it is possible that some jetting properties of the jetting assembly can change during the lifetime of a jetting assembly, i.e. until the assembly is empty of viscous medium and needs to be exchanged. Therefore, a calibration may desirably be performed each time the jetting apparatus is taken into operation after having been idle, regardless whether or not an exchange of jetting assembly in the apparatus has been performed. According to other embodiments, a calibration is performed following a predetermined time period, or following a predetermined number of jetted droplets.

According to preferred embodiments of the invention, prior to a planned calibration, a test is made to determine whether or not a calibration procedure is necessary. If not, the planned calibration procedure is not performed. Consequently, there will be no unnecessary interruptions for performing redundant calibrations.

It might, however, also be possible to rely on factory calibration, i.e. that the assembly is calibrated following manufacture or filling thereof, prior to mounting of the assembly in a jetting apparatus. However, this would require that any changes over time that might occur for any of the above-mentioned jetting properties are small compared to the desired accuracy. In order to reduce mechanical tolerances and manufacturing costs, it is advantageous to use a calibration procedure that is performed following the mounting of the assembly in the jetting apparatus. Further, the provision of factory calibration would not be able to compensate for the deviations in alignment that might occur during or following mounting of the assembly.

One example where factory calibration can be preferred can be the case when the exit velocity of the droplet does not change over time. Then, the exit velocity can be measured after filling the assembly with viscous medium, but before mounting in the jetting apparatus, and the information regarding the exit velocity can be stored in data storage means provided in the assembly. In that case, the procedure for obtaining calibration information, an example of which being described in greater detail below, can be considerably simplified.

According to an embodiment of the invention, the information obtained through any or all of the above described calibration measurements may be stored in storing means of the jetting assembly. Thus, the calibration measurement results, as well as any other suitable characteristics of the assembly, may be used for later calibration procedures for the jetting assembly.

When having obtained the calibration information, the jetting parameters can be adjusted, for example the trigger positions can be adjusted on the basis of the obtained calibration information. By trigger position is meant the location of the nozzle when the a droplet is triggered, or the time window during which jetting of the droplet is triggered.

It should be noted, that even though it is likely to be at least slight deviations in offset and alignment from one individual assembly to another, the same individual, however, is likely to reproduce well between successive mountings in the same machine. Thus, according to preferred embodiments of the invention, the information obtained from the calibration procedure is carried by the assembly itself. Preferably, the stored calibration information is related to the specific machine in which the assembly is mounted.

In the embodiments where a portion of the substrate is used as a calibration surface, prior to obtaining the calibration information, fiducial markers or reference points on the substrate are detected and registered. According to one embodiment, only one marker is used. Then, only the position of the substrate is known.

According to a preferred embodiment, two markers are used. Then, compensation for a skewed or tilted substrate can be performed.

According to an even more preferred embodiment, three markers are used. Then, an error in the scaling can also be compensated for.

The manners in which an error in the position, the scaling, or a possible skewing of the substrate is addressed and compensated for is well known to those skilled in the art and will therefore not be further described.

Alternatively, when a calibration station is used, the characteristics and properties of the calibration surface in the calibration station is determined when the machine is assembled. Therefore, there is no need for further measurement of reference points on the calibration surface.

According to a preferred embodiment of the invention, the angular deviation of the jetting direction is determined. Said deviation being the difference between the actual jetting direction and the nominal jetting direction, which preferably is essentially perpendicular to the plane of the substrate. According to one embodiment, the angular deviation is determined by first jetting one or more droplets at selected positions with the nozzle at a fixed distance from the substrate, i.e. at a fixed Z-position. Then, the distance between the nozzle and the substrate is increased or decreased by a controlled, accurately determined distance, followed by the jetting of one or more droplets at the new, fixed Z-position of the nozzle. By measuring the result from the jetting at the two Z-positions and comparing them, the direction and the amplitude of the angular deviation can be determined. If the offset of the measured deposits at both heights are essentially the same, there is essentially no angular deviation.

A source of error relating to the manufacture of electronic circuit boards or the like are the properties of the substrate itself. Occasionally, the substrate onto which viscous medium is to be applied is somewhat warped. According to a preferred embodiment of the invention, this warpage is detected and mapped, preferably using a vision device, e.g. a camera, in combination with suitable lighting for detecting the height of measured points on the substrate. When having mapped the warpage of the substrate, the trigger positions are preferably adjusted in order to compensate for the warpage. According to an alternative embodiment, the Z position of the jetting assembly, i.e. Z position of the nozzle, is continuously adjusted such that the distance between the nozzle and the corresponding position of the warped substrate is kept constant.

The present invention is particularly advantageous when used in combination for a jetting apparatus adapted for "drop-on-demand" jetting. Drop-on-demand jetting should be interpreted as a method of jet dispensing where individual drops of a medium are formed at the end by the forward momentum of a fluid being ejected out of a small orifice. The jet is formed by rapidly changing the volume of a chamber filled with the medium. With drop-on-demand jetting it is possible, as implied by the terminology, to eject or shoot a single droplet at any chosen time.

Further objects and advantages of the present invention will be discussed below by means of exemplary embodiments.

BRIEF DESCRIPTION OF THE ACCOMPANYING FIGURES OF DRAWINGS

Exemplifying embodiments of the invention will be described below with reference to the accompanying drawings, in which.

DESCRIPTION OF EXEMPLARY EMBODIMENT

With reference to the accompanying figures, there will now be described an embodiment of the inventive method of the present invention. First, a jetting assembly and an apparatus for jetting for which the assembly is intended are described with reference to FIG. 1.

Figure 1:
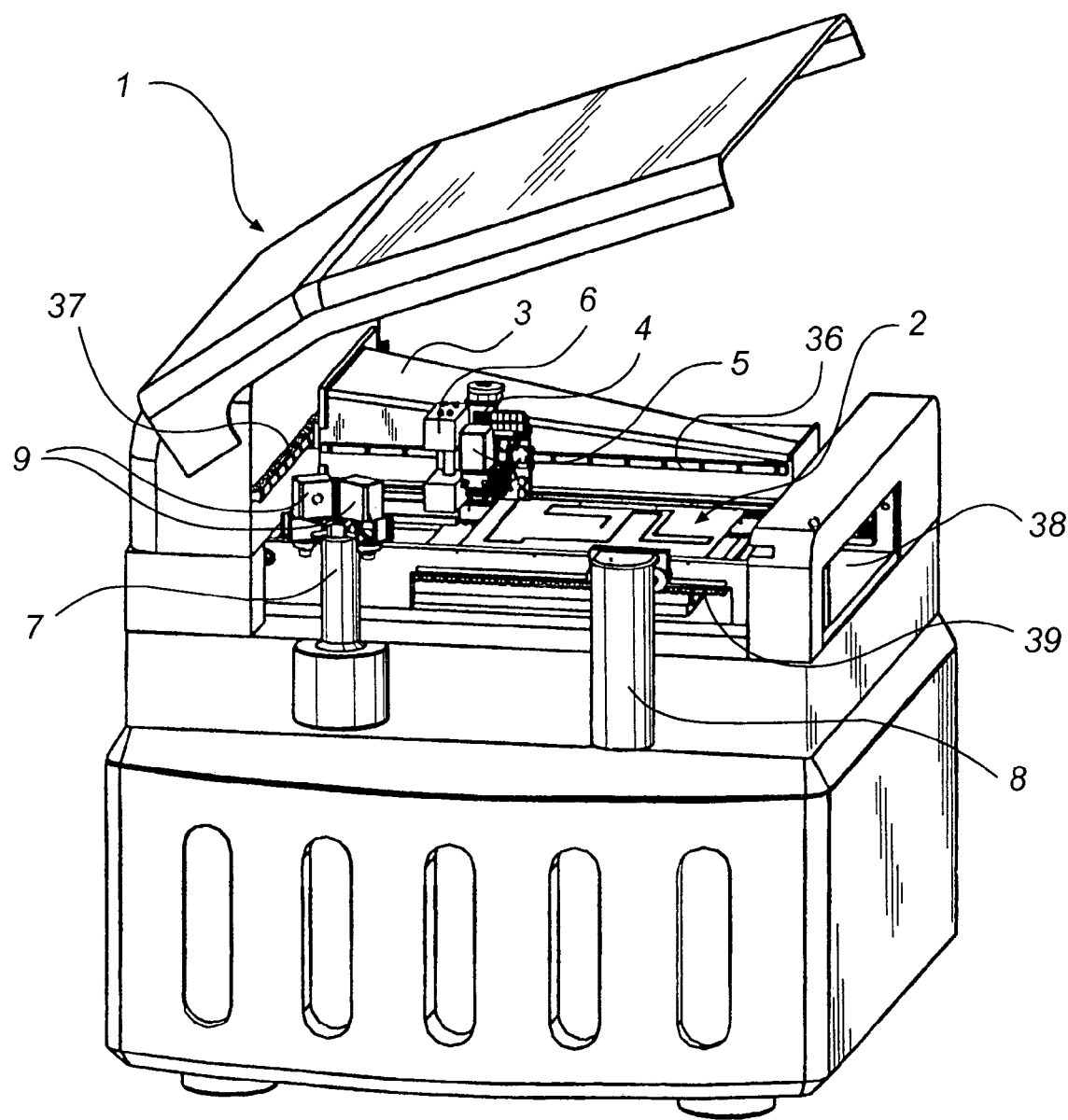
FIG. 1 is a schematic perspective view of an embodiment of the machine according to the present invention.
Figure 2:
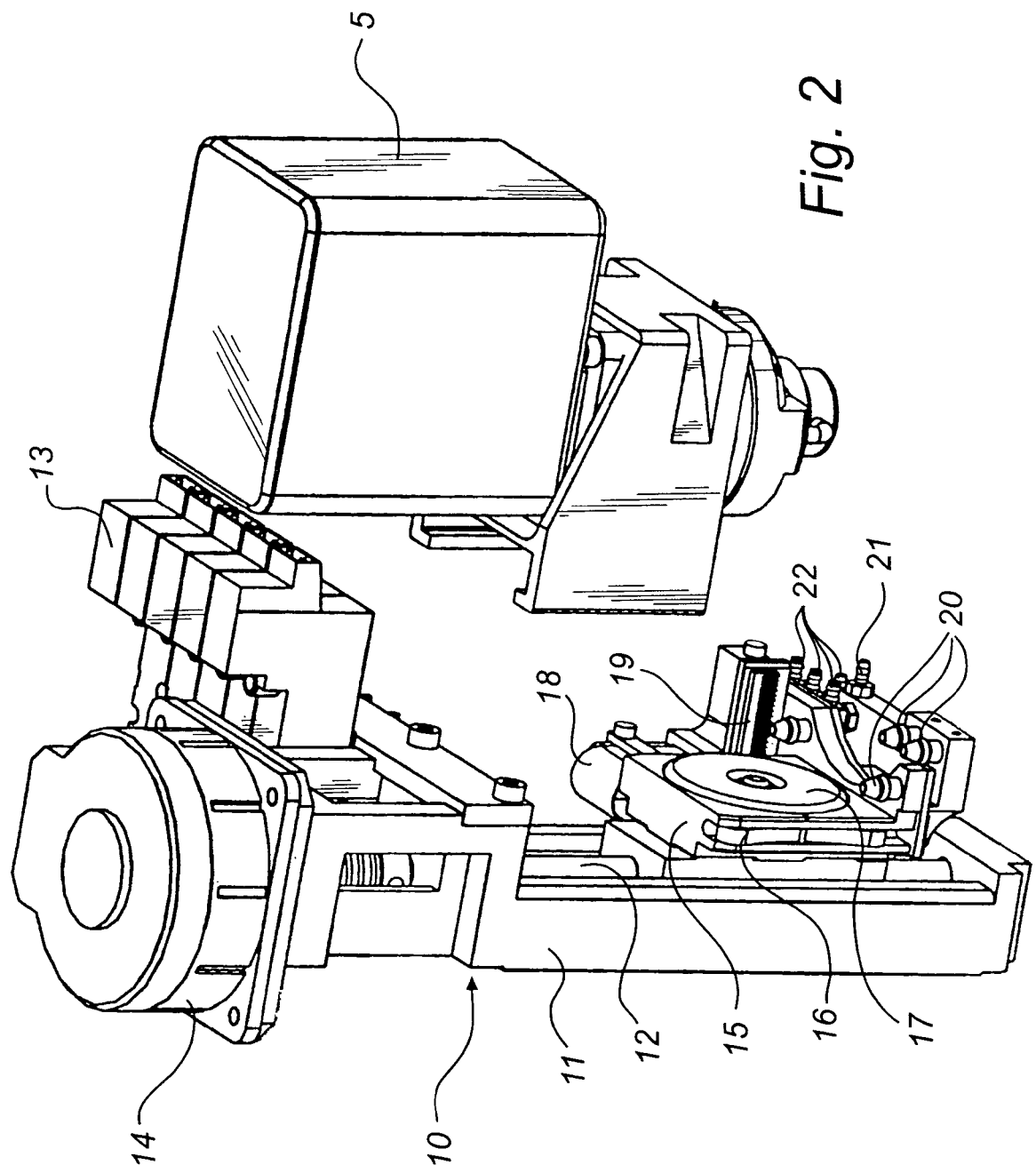
FIG. 2 is a schematic perspective view from above of an embodiment of the docking device and assembly of the present invention.

FIG. 1 illustrates a presently preferred embodiment of a machine 1 for providing a substrate 2 with deposits by jetting droplets of a viscous medium onto the substrate 2, in accordance with the present invention. Let us for simplicity assume that the viscous medium is solder paste, which is one alternative as defined above. In this embodiment the machine 1 is of a type comprising an X-beam 3 and an X-wagon 4 connected with the X-beam 3 via an X-rail 36 and reciprocatingly movable along the X-rail 36. The X-beam, in turn, is reciprocatingly movably connected with a Y-rail 37, thereby being movable perpendicularly to the X-rail 36. The Y-rail 37 is rigidly mounted in the machine 1. Generally, the movements are driven by linear motors (not shown).

Furthermore, the machine 1 comprises a conveyor 38 for carrying the substrate 2 through the machine 1, and a fixing device 39 for fixing the substrate 2 when jetting is to take place.

Also, the machine 1 comprises a docking device 10 connected with the X-wagon 4 and an assembly 5 releasably mounted at the docking device 10. The assembly 5 is arranged for jetting droplets of solder paste, which impact and form deposits on the substrate 2.

Further, the machine 1 of the herein described embodiment comprises a calibration station 8, providing a calibration surface.

The machine 1 also comprises an exchange assembly support 7, supporting further assemblies 9, which may be substituted for the assembly 5 currently carried by the docking device 10.

Additionally, the machine 1 comprises a machine vision device 6, which in this embodiment is a camera. The camera 6 is used for determining the position and rotation of the substrate 2 and for checking the result of the jetting process by viewing the deposits.

As understood by those skilled in the art, the machine also comprises a control unit (not explicitly shown) executing software for running the machine.

Briefly, the machine 1 works as follows. The substrate 2 is fed into the machine 1 by means of the conveyor 38, upon which the substrate 2 is put. When the substrate 2 is in proper position under the X-wagon 4 it is fixed with the aid of the fixing device 39. By means of the camera 6, fiducial markers prearranged on the surface of the substrate 2 are located. These markers determine the precise position of the substrate. Then, by moving the X-wagon 4 over the substrate 2 in a predetermined (pre-programmed) pattern and operating the assembly 5 at predetermined locations, solder paste is applied on the substrate 2 at the desired locations. Should the assembly 5 run out of solder paste or should a different medium be required at certain locations, etc., the machine 1 is programmed to automatically exchange the assembly 5 for one of the further assemblies, or exchange assemblies, 9 stored at the exchange assembly support 7, and the application process will continue.

Figure 3:
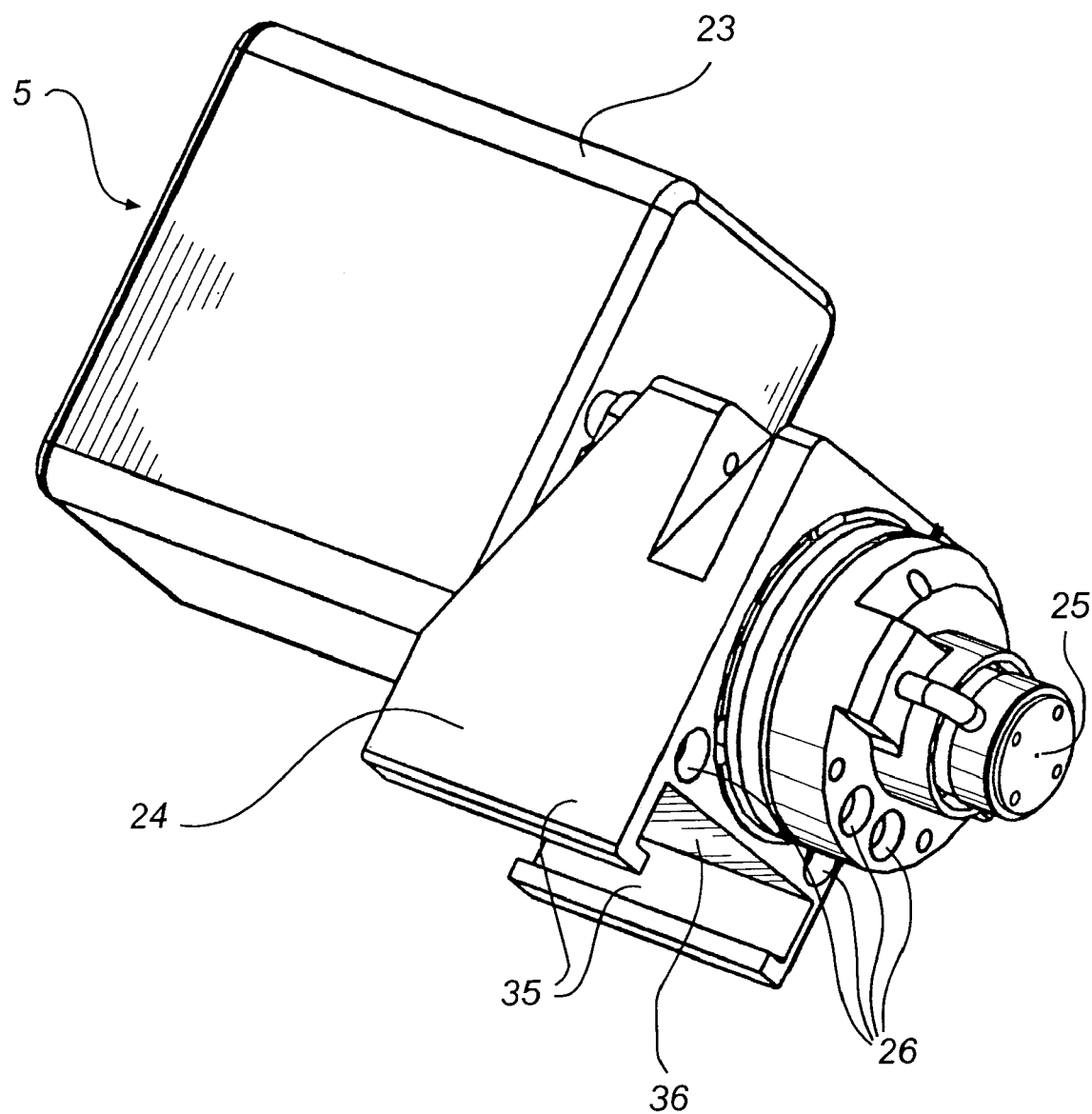
FIG. 3 is a schematic perspective view from below and from one side of the assembly shown in FIG. 2.
Figure 4:
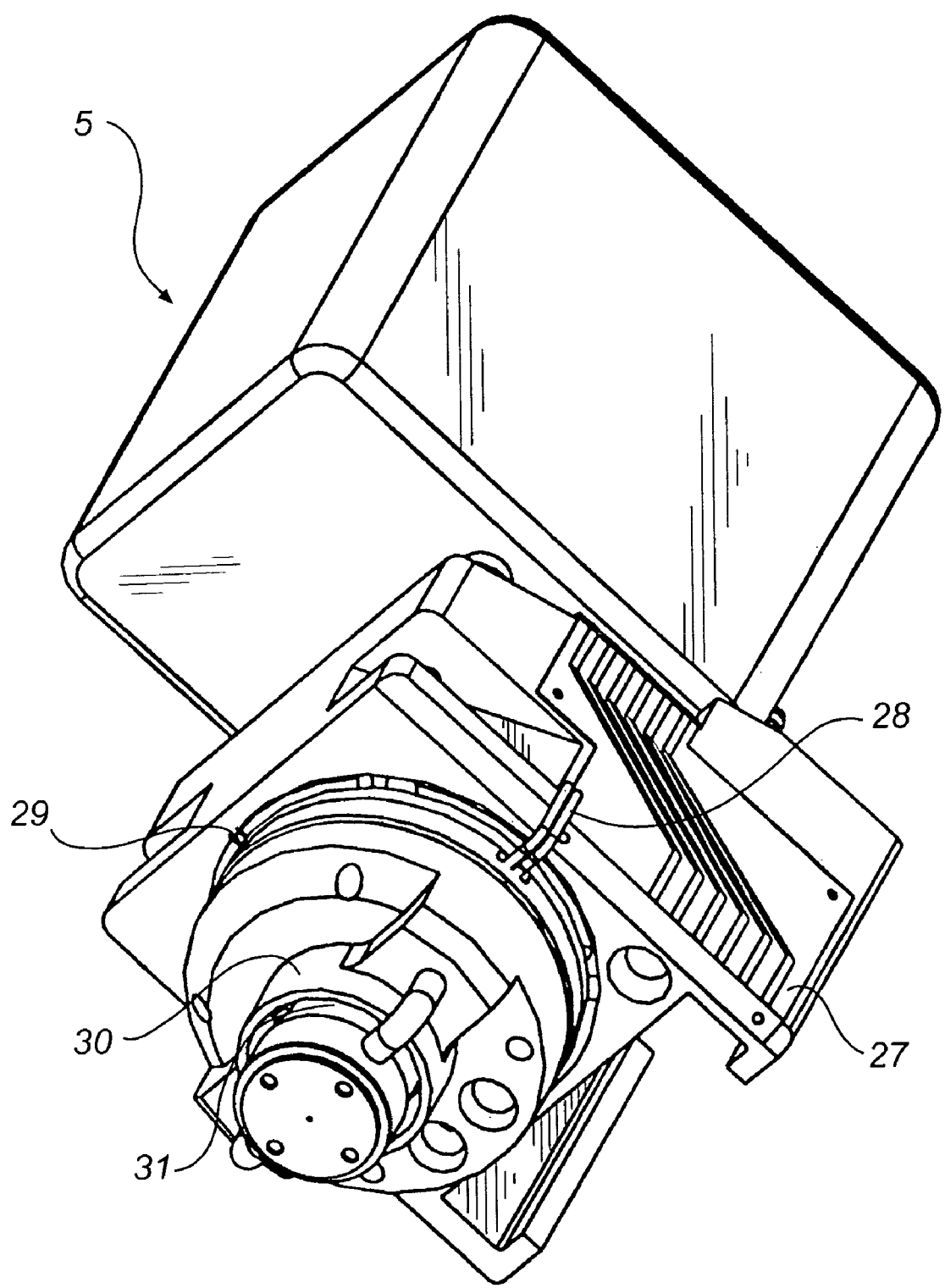
FIG. 4 is a schematic perspective view from below and from another side of the assembly shown in FIG. 2.

However, when acquiring a previously unknown assembly 9 from the exchange assembly support 7, the machine 1 will perform a calibration in order to ascertain that the dispensed droplets accurately will impact the substrate 2 at the predetermined locations. The reason for the calibration is that the position of an eject nozzle 25 of the assembly 5, see FIG. 3, may differ slightly from one assembly to the other, and the alignment of the assembly 5 at the docking device 10 may differ slightly from one docking to the other. It should be noted, that even though there is likely to be at least slight deviations in offset and alignment from one individual assembly to another, the same individual, however, is likely to reproduce well between successive mountings in the same machine. Thus, the information obtained from the calibration procedure is preferably carried by the assembly itself. Of course, the stored calibration information is related to the specific machine in which the assembly is mounted.

Figure 7:
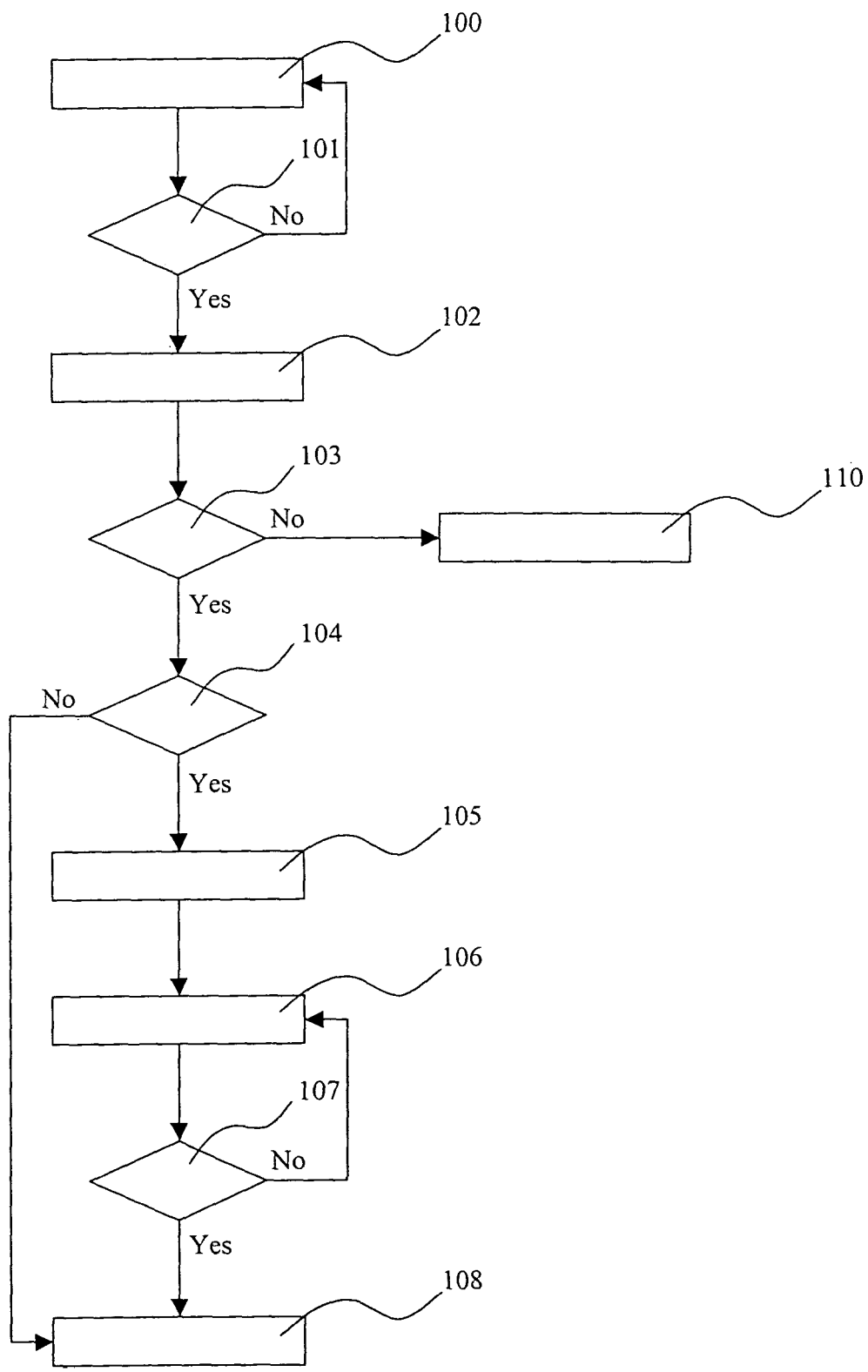
FIG. 7 is a flow chart illustrating an exchange and calibration procedure of the present invention.

The exchange and calibration procedure will now be described in more detail with reference to the flow chart of FIG. 7.

While jetting, at step 100, it is determined at step 101 whether an assembly exchange is required. This is done by checking whether the assembly 5 runs out of solder paste, whether another type of nozzle is required, or whether another type of medium is required. If an assembly exchange is required, the procedure is continued at step 102 by performing an assembly exchange. This is done by moving the X-wagon to the exchange assembly support 7, releasing the assembly 5 from the docking device 10 and putting it at an available place of the exchange assembly support 7, and loading an exchange assembly 9, which may be a specific predetermined one, into the docking device 10. Then, at step 103, it is checked that the new assembly is properly docked at the docking device 10. If not an error signal is generated, at step 110, and the machine 1 is halted. Otherwise, the procedure is continued at step 104, where it is determined whether the new assembly 9 needs to be calibrated. If a calibration is needed, the calibration procedure is continued at step 105. If not, the calibration procedure is regarded as completed and the jetting procedure is resumed at step 108.

At step 105, the X-wagon 4 is moved to the calibration station 8. Then, at step 106, a calibration of the assembly 5 is performed. It is preferred to generate a straight line of deposits, though any appropriate pattern is employable. Then, the line of deposits is viewed by the camera 6. If not all deposits are found, an error signal is generated and the machine is halted. Otherwise, the procedure is continued and the position of the line of deposits is determined and compared to an expected position. The deviation, if any, is defined as a nozzle offset. As mentioned above, there may be a slight difference in the position of the nozzle 25 compared to the position of the nozzle 25 of the previously docked assembly 5. In order to ascertain a high accuracy of the point of impact of the droplets on the substrate, a trigger window for the machine 1 is adjusted by means of the offset. Trigger window is understood by those skilled in the art as a time window within which a droplet has to be jetted, while moving the X-wagon 4 over the substrate 2, in order to impact the substrate 2 at the desired location. At step 107, it is determined whether the calibration process is completed. If so, the jetting is resumed at step 108. Otherwise, the calibration is continued at step 106.

Figure 8:
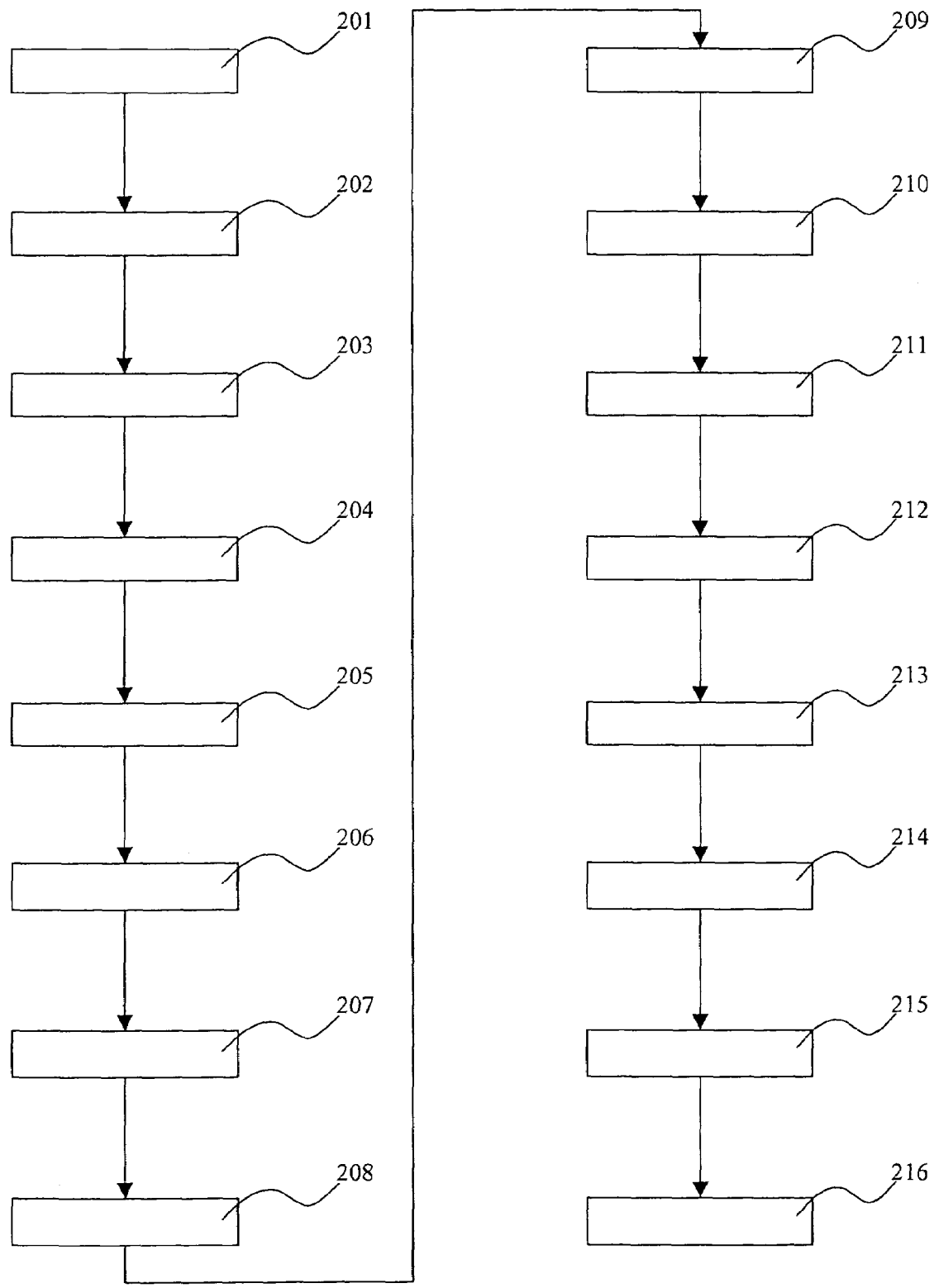
FIG. 8 is a flow chart illustrating a calibration procedure according to an embodiment of the present invention.

With reference to the flow chart of FIG. 8, there will be described in greater detail an embodiment of the present invention. The variables X and Y denotes the position in a plane parallel to the plane of the substrate 2 or the calibration surface. Consequently, the variable Z denotes the position perpendicular to the plane of the substrate 2 or calibration surface, i.e. the vertical position or the height.

First, at step 201, a fiducial mark on the calibration surface is located. This is achieved by positioning a vision device 6 over the fiducial mark and reading the encoders values. The positions are then stored as variables $X_0$ and $Y_0$. If a calibration station in the apparatus is used, these variables are already stored in storing means of the apparatus.

At step 202, the nominal nozzle offset is retrieved. This information can either be default values stored in the apparatus and used for every assembly or this information can be carried by the assembly and stored in storing means in the assembly. If the information is carried by the assembly, a more flexible system is achieved. These values are stored as variables $X_N$, $Y_N$, and $Z_N$.

At step 203, the nozzle 25 is positioned over a desired location. This implies moving the axes until the encoders shows the readings: $X_0-X_N-X^*$, $Y_0-Y_N-Y^*$, $Z_N$, where $X^*$ and $Y^*$ are chosen so as to position the nozzle 25 over the calibration surface.

At step 204, at least one droplet is jetted, the droplet forming a deposit on the calibration surface. If a plurality of deposits are deposited, any stochastic contribution to the jet direction can be averaged out to achieve better accuracy.

At step 205, the axes are moved to the location $X_0-X^*$, $Y_0-Y^*$. This would place the centre of the camera over the nominal position where the deposit has been placed.

At step 206, the offset of the deposit from the centre of the camera is determined. The results are stored as variables $\Delta X$ and $\Delta Y$. It should be noted that it is not difficult to achieve mechanical tolerances such that the deviation from the nominal position is within the field of view of the vision device 6.

Then, at step 207, the true nozzle offset can be calculated as: $X_{OFF}=X_N+\Delta X$ and $Y_{OFF}=Y_N+\Delta Y$.

At step 208, the nozzle 25 is made to travel over the calibration surface at a constant velocity. For ease of description, we assume that this velocity is in the X-direction only and that it is equal to $v_X$. A relatively large velocity is preferred from a smaller one since, with the larger velocity, a change of the nozzle position in the Z direction has a greater influence on the resulting X position of the deposit, which facilitates the determination of $\Delta X_2-\Delta X_1$, as described below.

At step 209, a predetermined number of deposits (at least one, in this case n number of deposits) is obtained through the jetting of droplets, starting at a position $X_0-X_{OFF}-X^*$, $Y_0-Y_{OFF}-Y^*-Y_{arb}$, where $Y_{arb}$ is chosen so as to position the nozzle 25 over another position on the calibration surface. The X positions of these deposits should be $$Xi=X_0-X_{OFF}-X^*+v_X/v_{out}*h_1+i*v_X/f$$

where $v_{out}$ is the exit velocity of the jet from the nozzle 25, $h_1$ is the distance from the nozzle 25 to the calibration surface when the Z position equals $Z_N$, f is the frequency with which the jets are ejected, and i takes the values 0, 1, . . . , n−1.

At step 210, the nozzle position is altered in the Z direction a predetermined amount $\Delta h$. Preferably, the nozzle 25 is raised in order to avoid any risk of contact between any part of the assembly and the calibration surface. In order to get a sufficient difference, a substantially large alteration is preferred. However, if the nozzle 25 is raised too much, the stochastic angular deviation in jet direction will have a greater impact on the jetting result due to the longer time in flight. A typical value could be 1 mm.

At step 211, the nozzle 25 is made to travel over the calibration surface at said constant velocity.

At step 212, a predetermined number of deposits (at least one, in this case n number of deposits) is obtained through the jetting of droplets, starting at a position $X_0-X_{OFF}-X^*$, $Y_0-Y_{OFF}-Y^*-2Y_{arb}$. The X positions of these deposits should be $$X_j = X_0 - X_{OFF} - X^* + v_x/v_{out} * h_2 + j*v_x/f$$

where $h2-h1=\Delta h$ and j takes the values $0, 1, \ldots, n-1$.

At step 213, all $X_i$ and $X_j$ are determined using the vision device 6.

At step 214, $v_x/v_{out}*h_1=\Delta X_i$ is defined as the mean value of $X_i-(X_0-X_{OFF}-X^*+i*v_x/f)$.

Also, at step 214, $v_x/v_{out}*h_2=\Delta X_2$ is defined as the mean value of $X_j-(X_0-X_{OFF}-X^*+j*v_x/f)$.

At step 215, the exit velocity of the jetted droplet is calculated as $v_{out}=v_x*\Delta h/(\Delta X_2-\Delta X_1)$, which is deducted from $v_x/v_{out}*h_2 - v_x/v_{out}*h_1 = \Delta X_2 - \Delta X_1$.

Finally, at step 216, we can now calculate the distance from the nozzle 25 to the calibration surface when the Z encoder shows the value $Z_N$. This is defined as $h_1 = \Delta X_1 * v_{out}/v_x = \Delta h * \Delta X_1/(\Delta X_2 - \Delta X_1)$.

If it turns out that the exit velocity does not change over time, the exit velocity can be measured after assembly refill, prior to mounting of the assembly in the jetting apparatus, and the exit velocity information stored in the assembly. In that case, the procedure above can be simplified.

Figure 9:
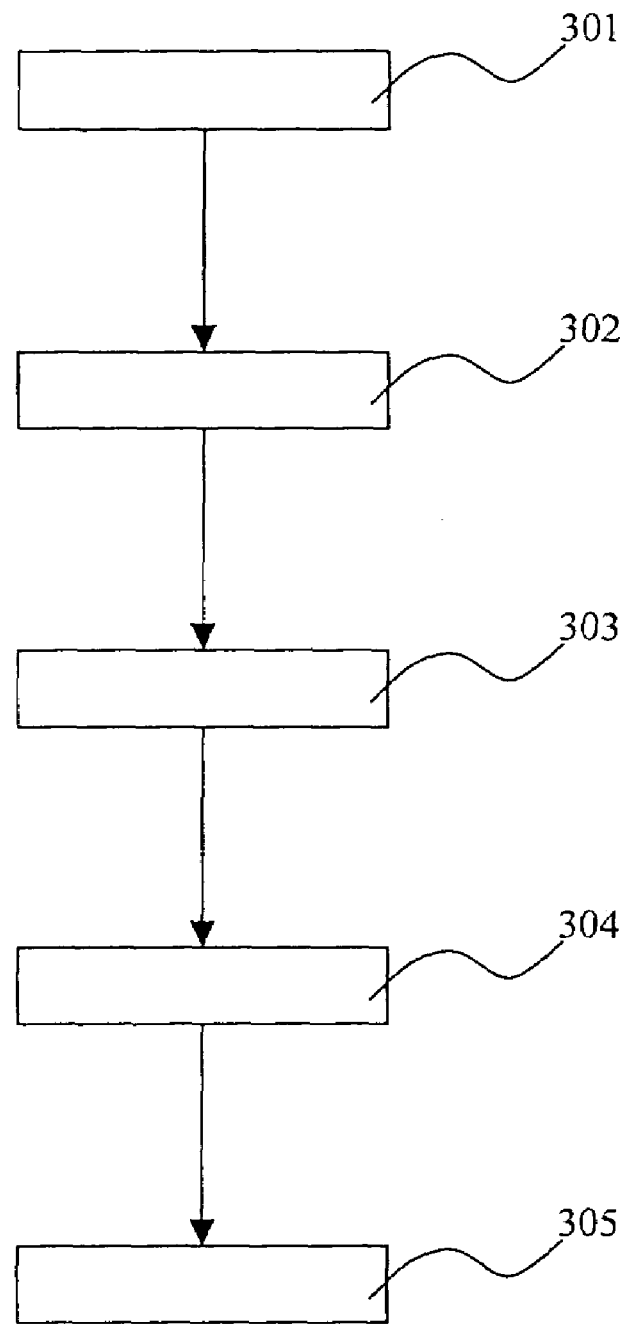
FIG. 9 is a flow chart illustrating an example of possible adjustments following the calibration procedure shown in FIG. 8.

Once the nozzle offset in the plane parallel to the plane of the substrate 2, the nozzle height, and the exit velocity of the droplet have been determined the trigger positions can be adjusted accordingly. For instance, if a deposit is desired at position X, Y on a substrate 2, X and Y being measured in the co-ordinate system of the substrate 2, one could proceed as follows, with reference to FIG. 9.

At step 301, the position in machine co-ordinates of at least one fiducial marker on the substrate 2 is determined. If only one marker is used, only the position of the substrate 2 is known. If two markers are used, compensation for a skewed substrate 2 can be performed. If three markers are used, also an error in the scales can be taken care of. For ease of description, we assume that the board is perfectly aligned and scaled, but translated so that x=y=0 in substrate co-ordinates corresponds to machine co-ordinates $X=X_0$, $Y=Y_0$. Thus, the desired deposit location is $X_0+x$, $Y_0+y$ in machine co-ordinates. Machine co-ordinates is here understood as encoder readings when the centre of the camera is at a specific position.

Then, at step 302, the velocity the machine will have when passing over the desired deposit location is retrieved. In this specific case, this data has been previously compiled. The reason for this previous compilation is to achieve an optimal path along the substrate 2.

At step 303, the height of the substrate 2 is retrieved. This can be done either by measuring it with the vision device 6 or retrieving the information from a database operatively connected to or located in the machine. Note that the height that is measured is the distance from the vision device 6 to the substrate 2. If sufficient planarity of the substrate can be guaranteed, a more accurate measurement of nominal Z position can be performed when the machine is assembled. In that case, the difference in height from the calibration surface to the nominal work piece surface is preferably measured.

At step 304, a desired nozzle height over the substrate 2 is chosen, for example the height h. Using the value of $h_1$ described above and the known height of the substrate 2, a suitable Z encoder reading can be calculated. For instance, if the distance from the vision device 6 to the calibration surface and to the substrate 2 is $H_1$ and $H_2$, respectively, the Z position should be $Z=Z_N+H_2-H_1+h-h_1$.

Finally, at step 305, the trigger position is, thus, calculated to be at $X_0+x-X_{OFF}-v_x*h/v_{out}$, and $Y_0+y-Y_{OFF}-v_y*h/v_{out}$, where $v_x$ and $v_y$ are the velocities in the x and y directions, respectively.

Further, in the described embodiment of the invention, if the substrate is warped, the warpage is mapped prior to the start of the jetting procedure. Then, the warpage can be compensated for in two alternative manners. According to the first alternative, the trigger positions in the X and Y directions are adjusted accordingly. According to the second alternative, the warpage is compensated for by adjusting the Z axis movement to keep the distance between the nozzle 25 and the warped substrate 2 constant as the nozzle 25 travels along the substrate.

Figure 10:
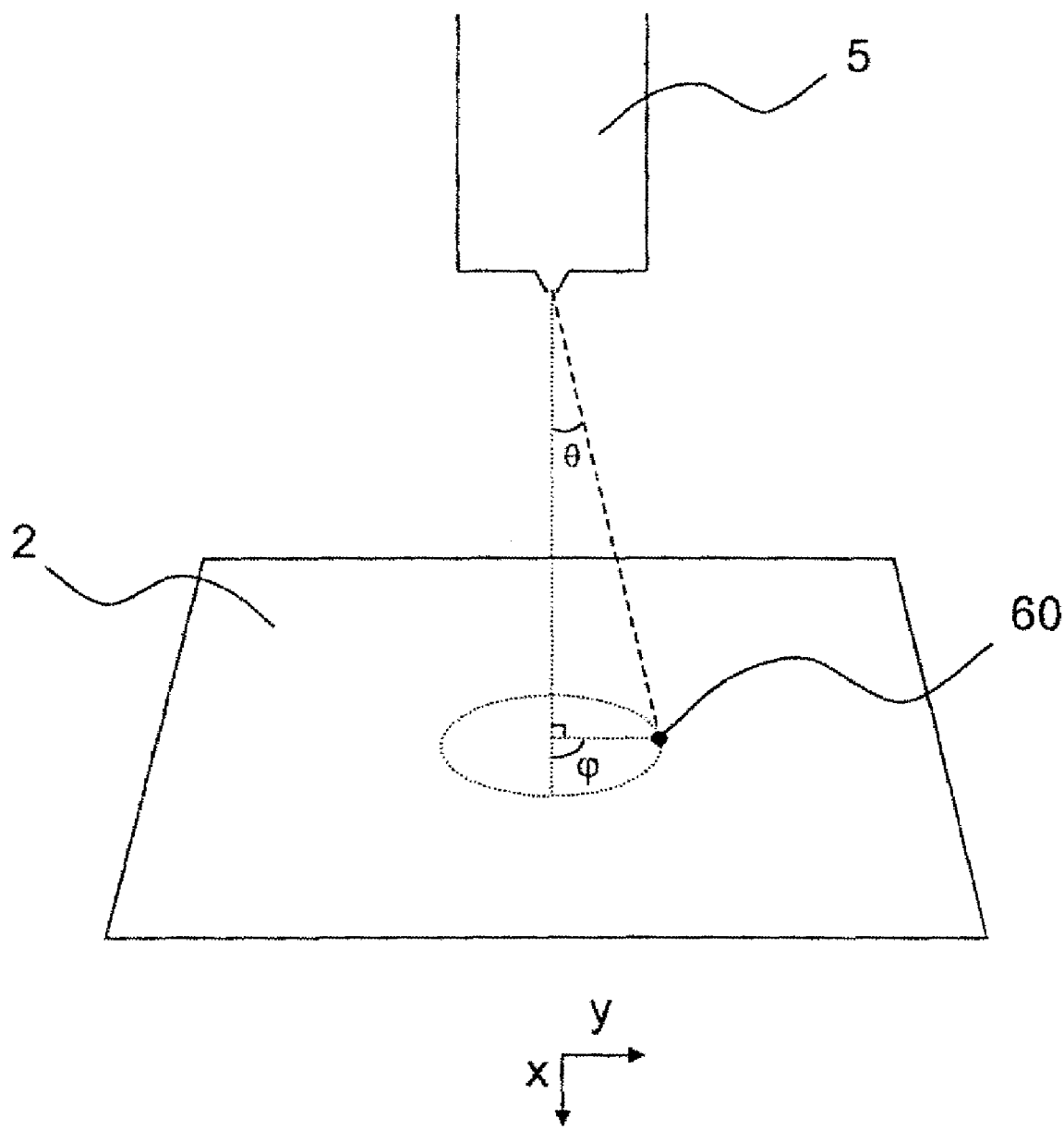
FIG. 10 is a schematic illustration of an angular deviation in the direction of jetted droplets.

In the above it has been assumed that the jet is ejected essentially along the Z axis, i.e. perpendicular to the plane of the substrate or the calibration surface. As mentioned above, a stochastic angular error can be present and taken care of, if said error is not so large that it results in unacceptable errors in the final position of the deposit. However, if the assembly for some reason has a constant angular ejection error, more problems can arise. An example is given in FIG. 10, in which the angular error has been greatly exaggerated for illustration purposes. In FIG. 10, the assembly 5 and the substrate 2 is shown in schematic form. Reference numeral 60 denotes a deposit resulting from jetting of a droplet of solder paste onto the substrate. Thus, assume that there is a constant angular error characterised as the angle parameters θ and ϕ, representing errors in polar angle and in plane angle, respectively, where ϕ=0 denotes the X direction. This means that the exit velocity will have components not only in the Z, but also in the X and the Y direction.

The three velocity vector components can thus be written as $v_{out,x}=v_{out}*\sin\theta*\cos\phi$, $v_{out,y}=v_{out}*\sin\theta*\sin\phi$, $v_{out,z}=v_{out}*\cos\theta$, respectively. The velocity component along the X-axis will result in different results in dependence of whether the wagon velocity, $v_x$, is applied in the positive or negative direction in steps 208 and 211 described above. The velocity component along the Y-axis will not result in any shift in step 208 described above since this deviation is absorbed in the offset calculated in step 207. However, when jetting from the second height $h_2$, the deposits will shift from the expected position because of the velocity along Y and the change of the time that the droplet is in flight. According to this embodiment of the invention, by jetting droplets while moving in both the positive and the negative X direction, respectively, and by detecting a shift in Y position correlated to a change in the nozzle height, one can determine the two new unknown parameters θ and ϕ.

As an alternative to the above described procedure, the angular deviation can according to one embodiment be obtained by the following procedure.

First, at least one droplet is jetted, the droplet forming a deposit on the calibration surface. Again, a plurality of deposits may be deposited to achieve better accuracy. Preferably, each droplet is jetted when the nozzle is standing still, i.e. there is no relative movement between the nozzle and the calibration surface. The resulting position of said first deposit(s) on the substrate is determined with the camera and stored.

Then, the nozzle position is altered in the Z direction a predetermined amount Δh, and at least one droplet is jetted from the second height. Again, there is no movement of the nozzle during the jetting of each droplet.

The resulting positions of said second deposit(s) on the substrate is determined and compared with the positions of the first deposit(s). The difference can be described as ΔX and ΔY, which can then be used to determine the two unknown parameters θ and φ using the following equations:

$$\tan(\phi)=\Delta Y/\Delta X$$

$$\tan(\theta)=\sqrt{\Delta Y^2+\Delta X^2}/\Delta h$$

In the above, there has been described a calibration procedure following the exchange of a jetting assembly. However, the described calibration procedure can be performed even though there has been no exchange. Thus, calibration can be performed whenever desired, for instance due to measured deviations and/or ordered by the operator.

Preferred and further embodiments of the docking device and the assembly will now be described in greater detail with reference to FIGS. 2–6. The docking device 10 comprises an assembly support 15 and a stand 11. The assembly support 15 is arranged at the stand 11 and is reciprocatingly movable along the length of the stand 11. Consequently, the direction of movement is in a Z-direction substantially perpendicular to the substrate 2. This motion is realised with the aid of a Z-motor 14 and a ball screw 12, appropriately interconnected. The motion along the stand 11 is used for docking the assembly 5 and for adjusting the height over the substrate when jetting.

The assembly 5 comprises an assembly holder 24 having first holding elements, in the form of two opposite L-shaped legs 35 and a wall 36 connecting them, wherein the legs 35 and wall 36 together define a first slot. The first slot mates to the assembly support 15 of the docking device 10. When docked, the assembly 5 is accurately positioned and retained by means of an assembly alignment device, constituted by a spring 16, exerting a force on one of the legs 35, and a pneumatically operable assembly locking element, here constituted by a locking piston 17 exerting a force on the wall 36.

Figure 6:
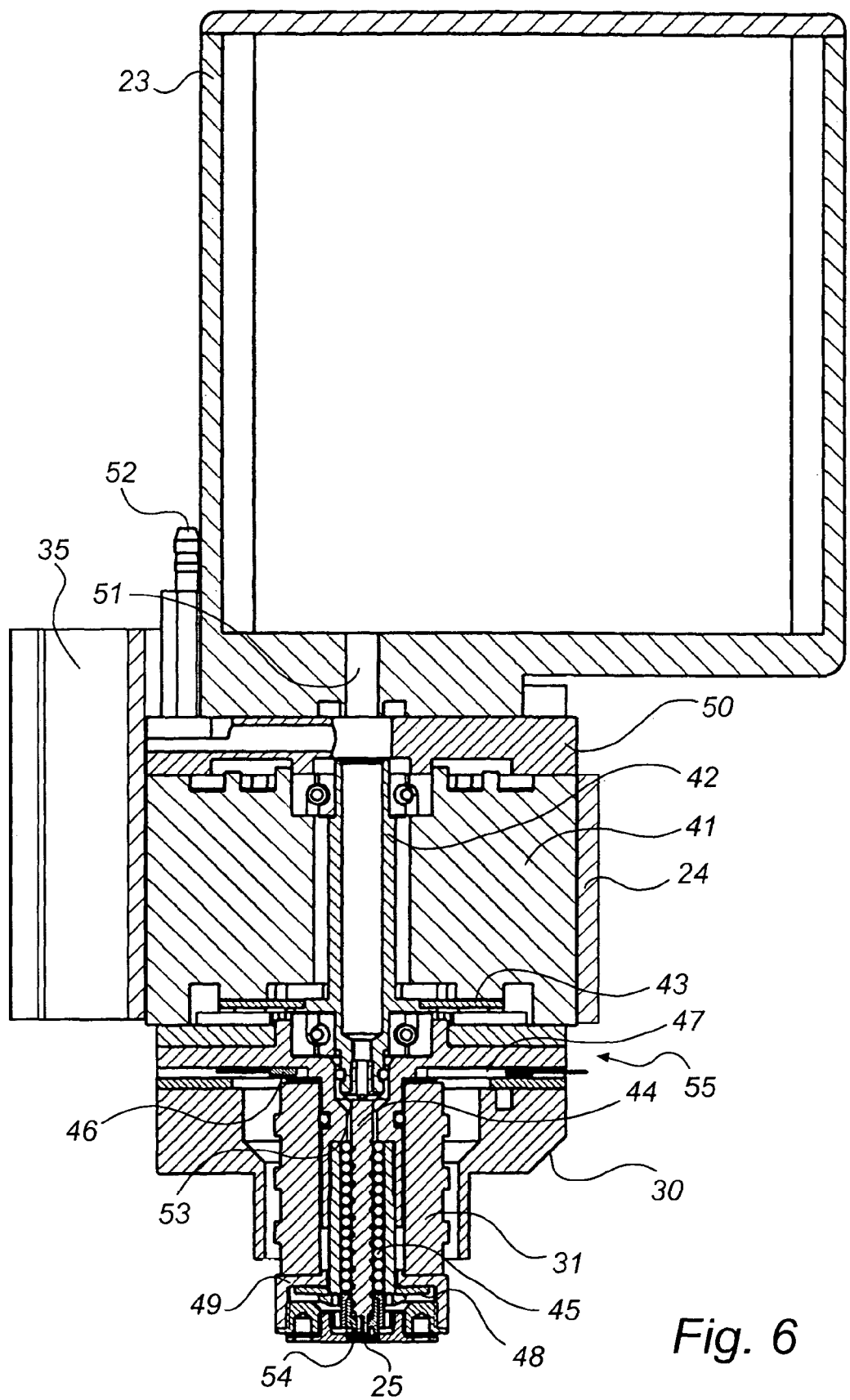
FIG. 6 is a schematic sectional view of the assembly shown in FIG. 2.

Further, the assembly 5 comprises a viscous medium container, or solder paste container, 23, a nozzle 25, and an eject mechanism 55, see FIG. 6, connected to the container 23 and the nozzle 25. The eject mechanism 55 is arranged for feeding solder paste from the container 23 and ejecting it through the nozzle 25 in a way which is defined as jetting or non-contact dispensing.

The eject mechanism 55 will now be further described. It is similar to the one disclosed in the above-mentioned International patent publication WO 00/61297, which is incorporated herein in its entirety by reference. The eject mechanism 55 from the outside is hidden by assembly holder 24 and by a cooling flange 30. In the cross sectional view in FIG. 6, a proposed outline of the eject mechanism 55 is shown. The solder paste is forced by means of pressurised air out of a hole 51 in the bottom of the solder paste container 23. The pressurised air is supplied through a nipple 52, a hose and a suitable connector (not shown) in the container 23. The feed hole 51 is connected to a hole in a motor support 50 and in a motor axis 42 of a stepper motor 41. A feed screw 44 is mounted on the motor axis 42. The feed screw 44 has an axial bore 53 through which the solder paste flows. The solder paste is further transported by the feed screw 44 rotated by the motor 41. The feed screw 44 rotates in a stack of o-rings 45. These o-rings 45 prohibit undesired smearing of the solder balls in the paste. The feed screw 44 transports the paste into an active chamber formed by the end of the feed screw 44, the nozzle 25 and a bushing 54. In order to eject droplets, an actuator 31 is rapidly discharged, thus moving the nozzle 25 towards the feed screw 44 and diminishing the volume of said active chamber. The actuator 31 is pre-loaded with a cup spring 48 and an actuator support 49. The assembly 5 uses pressurised air for several tasks, e.g. providing a slight overpressure for forcing the solder paste into the eject mechanism 55, cooling of the actuator 31, and cooling of the stepper motor 41. The pressurised air is supplied via a pneumatic interface comprising inlets 26, positioned to interface with complementary pneumatic interface comprising nipples 20, of the docking device 10. Cooling of the actuator 31 is realised with the aid of the cooling flange 30 providing a slit between its walls and the actuator 31 where cooling air can flow freely. Furthermore, in order to obtain a stable temperature during the jetting procedure, the cooling of the actuator 31 is combined with a heater 47, which is regulated by the measurement results from a thermometer 48.

Signal connections are provided as interface at the assembly 5 and connectable to complementary signal interface of the docking device 10. These connections of the assembly 5, inter alia, are for supplying the stepper motor 41, the actuator 31 via leads 28, for measuring temperature via leads 29 and the thermometer 46, which constitutes a Pt-100 sensor or the like. Said signal interface is implemented as a male contact 27 and interfaces the corresponding signal interface implemented as a female contact 19 at the docking device 10. The male contact 27 is in this embodiment a reinforced part of a flexible circuit board. Not previously mentioned signals that can be provided via this interface are heater current, assembly identity information, and driving signals for the stepper motor 41. Extensions of this list are obvious for those skilled in the art. In excess to the above mentioned female contact 19, signal connections at the docking device 10 comprise a flexible circuit board 18, connected to control electronics (not shown) located on the X-wagon 4.

The nipples 20 of the complementary pneumatic interface of the docking device 10 are connected, via internal channels of the docking device 10, to a set of valves 13 and to input nipples 22. The airflow is controlled by said set of valves 13 arranged at the upper end of the docking device 10. In a conventional fashion, external hoses (not shown) are connected to the input nipples 22. The above-described piston 17 is pneumatically actuated with pressurised air supplied through a nipple 21 and one of the valves 13.

Figure 5:
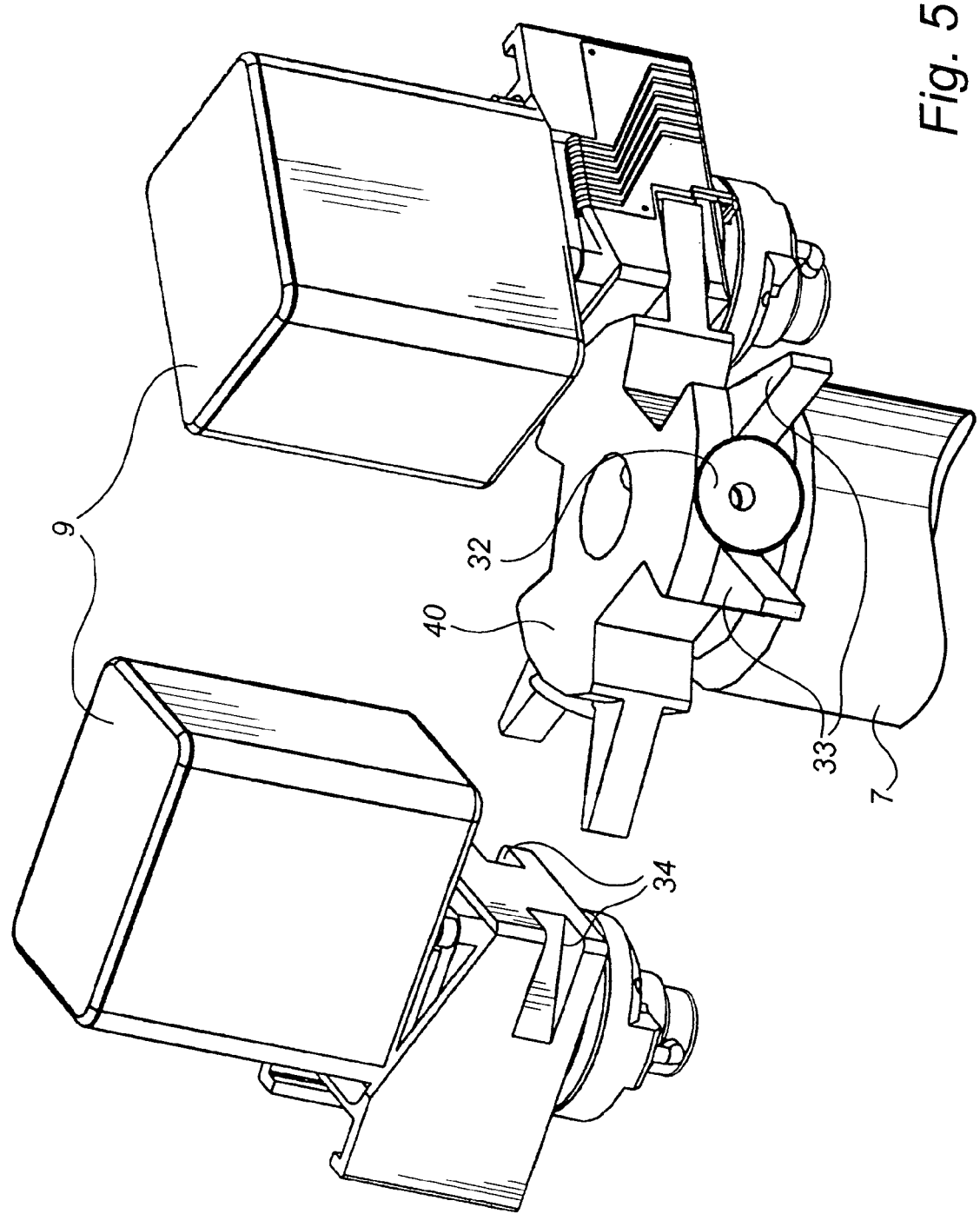
FIG. 5 is a perspective view from above of the assembly of FIG. 2 and of an embodiment of the exchange assembly support of the present invention.

As shown in FIG. 5, the above mentioned exchange assembly support 7 has an exchange wheel 40 comprising at least two, and in this embodiment three, assembly seats. Each seat is defined by a suction cup 32 to hold the assembly 9 firmly and a slotted jaw 33 which mates with cuts 34 in the assembly. The exchange wheel 40 is rotatable.

At the calibration station, the calibration surface is according to an alternative embodiment constructed as a tape assembly. Thereby, there is no need for cleaning the surface after each calibration. Instead, the tape is simply driven forward for a short moment.

As a further alternative, there is no calibration station. Instead, a portion of the substrate surface where the no solder paste is to be applied is used as a calibration surface.

In the method, the step of determining if calibration is required may be deleted, so that the calibration is always performed.

The above description refers to preferred embodiments of the present invention, which are included as exemplary embodiments only and must not to be seen as having a limiting effect on the scope of the present invention. On the contrary, many modifications and alterations are possible without departing from the scope of the invention as defined by the appending claims.

What is claimed is:

1. A method of improving the performance of a jetting assembly in an apparatus for jetting droplets of viscous medium on the fly onto a substrate, said jetting assembly being releasably mounted in said apparatus for jetting, said jetting assembly comprising a nozzle, an ejection mechanism connected to the nozzle, and a viscous medium container connected to the eject mechanism, the method comprising the steps of:

obtaining information relating to an XY-position of the nozzle in relation to a calibration surface, the XY-position being the position of the nozzle in a plane parallel to the plane of the calibration surface, obtaining information relating to a Z-position of the nozzle, the Z-position being the distance between the nozzle and the calibration surface, determining the exit velocity a droplet of viscous medium has when said droplet exits said nozzle, and adjusting, on the basis of said information relating to an XY-position of the nozzle, said information relating to a Z-position of the nozzle and said exit velocity, a trigger position of the nozzle for the subsequent jetting of droplets, wherein said step of obtaining information relating to an XY-position of the nozzle comprises jetting at least one first droplet at a nominally predetermined location on said calibration surface, said at least one first droplet thereby forming at least one first deposit on said calibration surface, determining the offset of the location(s) of said at least one first deposit in relation to said nominally predetermined location, and determining, based on said determined offset, the XY-position of the nozzle, and wherein the step of determining the exit velocity comprises moving the nozzle relative the calibration surface at a first predetermined relative velocity in a plane parallel to the plane of said calibration surface, jetting, during said movement, at least one second droplet, said jetting being performed by triggering said ejection mechanism when said nozzle is at (a) predetermined location(s), said at least one second droplet thereby forming at least one second deposit on said calibration surface, determining the location(s) of said at least one second deposit, calculating the difference between said predetermined and said determined locations, altering the distance between the nozzle and the calibration surface with a predetermined distance, moving the nozzle relative the calibration surface at a second predetermined relative velocity in a plane parallel to the plane of said calibration surface, jetting, during said movement, at least one third droplet, said jetting being performed by triggering said ejection mechanism when said nozzle is at (a) predetermined location(s), said at least one third droplet thereby forming at least one third deposit on said calibration surface, determining the location(s) of said at least one third deposit, calculating the differences between said predetermined and said determined locations, and determining, based on said calculated differences between said predetermined and said determined locations of said at least one second and at least one third deposits, the exit velocity a droplet of viscous medium has when said droplet exits said nozzle.

2. The method as claimed in claim 1, wherein said first and second predetermined relative velocities are the same.

3. The method as claimed in claim 1, wherein the Z-position of the nozzle is obtained by determining said Z-position mechanically.

4. The method as claimed in claim 1, wherein the Z-position of the nozzle is obtained by determining said Z-position with an electrical sensor.

5. The method as claimed in claim 1, wherein the step of obtaining information relating to a Z-position of the nozzle comprises:

moving the nozzle relative the calibration surface at a first predetermined relative velocity in a plane parallel to the plane of said calibration surface, jetting, during said movement, at least one second droplet, said jetting being performed by triggering said ejection mechanism when said nozzle is at (a) predetermined location(s), said at least one second droplet thereby forming at least one second deposit on said calibration surface, determining the location(s) of said at least one second deposit, calculating the difference between said predetermined and said determined locations, and determining, based on said calculated difference and said determined exit velocity, the Z-position of the nozzle.

6. The method as claimed in claim 1, wherein the step of obtaining information relating to a Z-position of the nozzle comprises:

determining said Z-position of the nozzle based on said exit velocity together with said calculated difference between said predetermined and said determined locations of said at least one second deposit or of said at least one third deposit.

7. The method as claimed in claim 1 or 8, further comprising the steps of:

moving the nozzle relative the calibration surface at a predetermined velocity in a plane parallel to the plane of said calibration surface, said relative velocity being different from the relative velocity when jetting said second or third droplets, jetting, during said relative movement, at least one fourth droplet, said jetting being performed by triggering said ejection mechanism when said nozzle is at (a) predetermined location(s), said at least one fourth droplet thereby forming at least one fourth deposit on said calibration surface, determining the location of said fourth deposit, calculating the difference between said predetermined and said determined locations, and determining, based on said calculated differences between said predetermined and said determined locations of said at least one fourth deposits and said at least one second or at least one third deposits, the angular deviation for the jetting direction of said droplets from a nominal jetting direction, said nominal jetting direction being essentially perpendicular to the plane of the calibration surface.

8. The method as claimed in claim 1, further comprising the steps of:
obtaining angular deviation information relating to the angular deviation of the actual jetting direction of said droplets from a nominal jetting direction, said nominal jetting direction being essentially perpendicular to the plane of the calibration surface, and
using also said angular deviation information as basis for said adjustment of the trigger position for the subsequent jetting of droplets.

9. The method as claimed in claim 8, wherein the step of obtaining said angular deviation information comprises:
jetting at least one first droplet at a nominally predetermined location on said calibration surface, said at least one first droplet thereby forming at least one first deposit on said calibration surface,
determining the offset of the location(s) of said at least one first deposit in relation to said nominally predetermined location,
altering the distance between the nozzle and the calibration surface with a predetermined value,
jetting at least one second droplet at a nominally predetermined location on said calibration surface, said at least one second droplet thereby forming at least one second deposit on said calibration surface,
determining the offset of the location(s) of said at least one second deposit in relation to said nominally predetermined location,
calculating the difference in offset between said at least one first deposit and said at least one second deposit, and
determining, based on said determined calculated difference, said angular deviation of the actual jetting direction of said droplets from the nominal jetting direction.

10. The method as claimed in claim 9, wherein the nozzle does not move relative the calibration surface during the jetting of each of said at least one first and said at least one second droplets.

11. The method as claimed in claim 1, wherein the calibration surface is a surface on said substrate.

12. The method as claimed in claim 1, wherein the calibration surface is a portion of said apparatus and is separate from said substrate.

13. The method as claimed in claim 12, further comprising the step of:
retrieving calibration surface information relating to characteristics of the calibration surface, said calibration surface information being stored in said apparatus.

14. The method as claimed in claim 1, further comprising the step of:
obtaining calibration surface information relating to characteristics of the calibration surface, said calibration surface information being obtained through the use of a vision device provided in said apparatus.

15. The method as claimed in claim 1, further comprising the steps of:
determining and mapping any warpage of the substrate, and
adjusting jetting parameters to compensate for said warping.

16. The method as claimed in claim 15, wherein said step of adjusting jetting parameters comprises the step of:

continuously adjusting the height of the nozzle relative said substrate, such that said nozzle is kept at a constant distance from said substrate during said jetting of viscous medium.

17. The method as claimed in claim 15, wherein said step of adjusting jetting parameters comprises the step of:
continuously adjusting trigger positions of the nozzle from a nominal trigger position thereof, such that the variation due to said warpage in the distance between the nozzle and the substrate resulting from the relative movement between the nozzle and the warped substrate is compensated for.

18. A method of improving the performance of a jetting assembly in an apparatus for jetting droplets of viscous medium on the fly onto a substrate, said jetting assembly being releasably mounted in said apparatus for jetting, said jetting assembly comprising a nozzle, an ejection mechanism connected to the nozzle, and a viscous medium container connected to the eject mechanism, the method comprising the steps of:
obtaining information relating to an XY-position of the nozzle in relation to a calibration surface, the XY-position being the position of the nozzle in a plane parallel to the plane of the calibration surface,
obtaining information relating to a Z-position of the nozzle, the Z-position being the distance between the nozzle and the calibration surface,
determining the exit velocity a droplet of viscous medium has when said droplet exits said nozzle,
obtaining angular deviation information relating to the angular deviation of the actual jetting direction of said droplets from a nominal jetting direction, said nominal jetting direction being essentially perpendicular to the plane of the calibration surface, and
adjusting, on the basis of said information relating to an XY-position of the nozzle, said information relating to a Z-position of the nozzle, said exit velocity, and said angular deviation information, a trigger position of the nozzle for the subsequent jetting of droplets,
wherein said step of obtaining information relating to an XY-position of the nozzle comprises
jetting at least one first droplet at a nominally predetermined location on said calibration surface, said at least one first droplet thereby forming at least one first deposit on said calibration surface,
determining the offset of the location(s) of said at least one first deposit in relation to said nominally predetermined location, and
determining, based on said determined offset, the XY-position of the nozzle, and
wherein said step of obtaining said angular deviation information comprises
jetting at least one first droplet at a nominally predetermined location on said calibration surface, said at least one first droplet thereby forming at least one first deposit on said calibration surface,
determining the offset of the location(s) of said at least one first deposit in relation to said nominally predetermined location,
altering the distance between the nozzle and the calibration surface with a predetermined value,
jetting at least one second droplet at a nominally predetermined location on said calibration surface, said at least one second droplet thereby forming at least one second deposit on said calibration surface, determining the offset of the location(s) of said at least one second deposit in relation to said nominally predetermined location, calculating the difference in offset between said at least one first deposit and said at least one second deposit, and determining, based on said determined calculated difference, said angular deviation of the actual jetting direction of said droplets from the nominal jetting direction.

19. The method as claimed in claim 18, wherein the nozzle does not move relative the calibration surface during the jetting of each of said at least one first and said at least one second droplets.

20. The method as claimed in claim 18, wherein the step of determining the exit velocity comprises:

retrieving exit velocity information from information storing means in which said velocity information has been previously stored, and calculating the exit velocity based on said velocity information.

21. The method as claimed in claim 18, wherein the step of determining the exit velocity comprises:

moving the nozzle relative the calibration surface;

jetting at least one droplet at a nominally predetermined location on said calibration surface, said at least one droplet thereby forming at least one deposit on said calibration surface;

determining the location(s) of said deposit(s); and calculating the exit velocity based on information relating to the Z-position of the nozzle, the relative velocity between the nozzle and the calibration surface, and the location(s) of said deposit(s).

22. The method as claimed in claim 18, wherein the step of obtaining information relating to a Z-position of the nozzle comprises:

moving the nozzle relative the calibration surface at a first predetermined relative velocity in a plane parallel to the plane of said calibration surface, jetting, during said movement, at least one second droplet, said jetting being performed by triggering said ejection mechanism when said nozzle is at (a) predetermined location(s), said at least one second droplet thereby forming at least one second deposit on said calibration surface, determining the location(s) of said at least one second deposit, calculating the difference between said predetermined and said determined locations, and determining, based on said calculated difference and said determined exit velocity, the Z-position of the nozzle.

23. The method as claimed in claim 18, wherein the calibration surface is a surface on said substrate.

24. The method as claimed in claim 18, wherein the calibration surface is a portion of said apparatus and is separate from said substrate.

25. The method as claimed in claim 24, further comprising the step of:

retrieving calibration surface information relating to characteristics of the calibration surface, said calibration surface information being stored in said apparatus.

26. The method as claimed in claim 18, further comprising the step of:

obtaining calibration surface information relating to characteristics of the calibration surface, said calibration surface information being obtained through the use of a vision device provided in said apparatus.

27. The method as claimed in claim 18, further comprising the steps of:

determining and mapping any warpage of the substrate, and adjusting jetting parameters to compensate for said warping.

28. The method as claimed in claim 27, wherein said step of adjusting jetting parameters comprises the step of:

continuously adjusting the height of the nozzle relative said substrate, such that said nozzle is kept at a constant distance from said substrate during said jetting of viscous medium.

29. The method as claimed in claim 27, wherein said step of adjusting jetting parameters comprises the step of:

continuously adjusting trigger positions of the nozzle from a nominal trigger position thereof, such that the variation due to said warpage in the distance between the nozzle and the substrate resulting from the relative movement between the nozzle and the warped substrate is compensated for.

* * * * *

UNITED STATES PATENT AND TRADEMARK OFFICE
CERTIFICATE OF CORRECTION

PATENT NO. : 7,011,382 B2 Page 1 of 1
APPLICATION NO. : 10/398712
DATED : March 14, 2006
INVENTOR(S) : William Holm et al.

It is certified that error appears in the above-identified patent and that said Letters Patent is hereby corrected as shown below:

Col. 16, Claim 7, line 1, "claim 1 or 8" should read --claim 1 or 6--

Signed and Sealed this

Eighth Day of August, 2006

JON W. DUDAS
*Director of the United States Patent and Trademark Office*